(12) United States Patent  
Yamamoto (10) Patent No.: US 6,941,118 B2  
(45) Date of Patent: Sep. 6, 2005

(54) NEGATIVE FEEDBACK AMPLIFIER AND METHOD OF CONTROLLING LOOP GAIN THEREOF

(75) Inventor: Hiroyuki Yamamoto, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 398 days.

(21) Appl. No.: 10/125,592

(22) Filed: Apr. 19, 2002

(65) Prior Publication Data

US 2002/0171476 A1 Nov. 21, 2002

(30) Foreign Application Priority Data

Apr. 20, 2001 (JP) ........................................ 2001-122778

(51) Int. Cl.$^7$ ............................ H01Q 11/12; H04B 1/04
(52) U.S. Cl. ................. 455/126; 455/127.2; 455/114.3; 375/296
(58) Field of Search ........................... 455/114.1, 114.2, 455/114.3, 126, 127.1, 127.2, 127.3; 375/295, 297, 296; 330/278, 291, 293

(56) References Cited

U.S. PATENT DOCUMENTS

| | | | | |
|---|---|---|---|---|
| 5,041,793 A | * | 8/1991 | Gailus | ............................ 330/2 |
| 5,423,082 A | * | 6/1995 | Cygan et al. | ................ 455/126 |
| 5,469,105 A | * | 11/1995 | Sparks | ........................ 330/129 |
| 5,507,017 A | * | 4/1996 | Whitmarsh et al. | .......... 455/126 |
| 5,574,992 A | * | 11/1996 | Cygan et al. | ................ 455/126 |
| 5,574,994 A | * | 11/1996 | Huang et al. | ................ 455/126 |
| 5,722,056 A | * | 2/1998 | Horowitz et al. | ............ 455/126 |
| 5,802,451 A | * | 9/1998 | Adachi et al. | ............... 455/126 |
| 6,384,677 B2 | * | 5/2002 | Yamamoto | .................... 330/10 |
| 6,693,956 B1 | * | 2/2004 | Yamamoto | ................... 375/219 |

* cited by examiner

Primary Examiner—Nguyen T. Vo
(74) Attorney, Agent, or Firm—Mattingly, Stanger, Malur & Brundidge, P.C.

(57) ABSTRACT

A negative feedback amplifier has input portions for receiving input signals, adder circuits, a quadrature modulator for performing a quadrature modulation on outputs of the adder circuits, a first signal level variable control circuit for adjusting a level of an output signal from the quadrature modulator, an amplifier circuit for amplifying an output of the first signal level variable control circuit, a feedback circuit for negative feedbacking an output of the negative feedback circuit to the adder circuit, and a second control circuit for controlling an adjusting amount in the first signal level variable control circuit based on the output signal levels of the adder circuits so that the output signal levels of the adder circuits becomes predetermined values. The feedback circuit includes a first control circuit for controlling a signal level of the feedback circuit so that the output signal level of the amplifier circuit becomes a predetermined value.

6 Claims, 8 Drawing Sheets

$Y = A \cdot X / (1 + A \cdot \beta)$

NEGATIVE FEEDBACK AMPLIFIER AND METHOD OF CONTROLLING LOOP GAIN THEREOF

CROSS-REFERENCE TO RELATED APPLICATIONS

The present application relates to subject matters described in co-pending applications Ser. No. 09/672,688 filed on Sep. 29, 2000 and Ser. No. 09/768,469 filed on Jan. 25, 2001 assigned to the assignee of the present application. The disclosures of these applications are incorporated herein by reference.

BACKGROUND OF THE INVENTION

The present invention generally relates to power amplifiers, and particularly to compensation for the non-linear distortion of a power amplifier having a negative feedback circuit.

Figure 2:
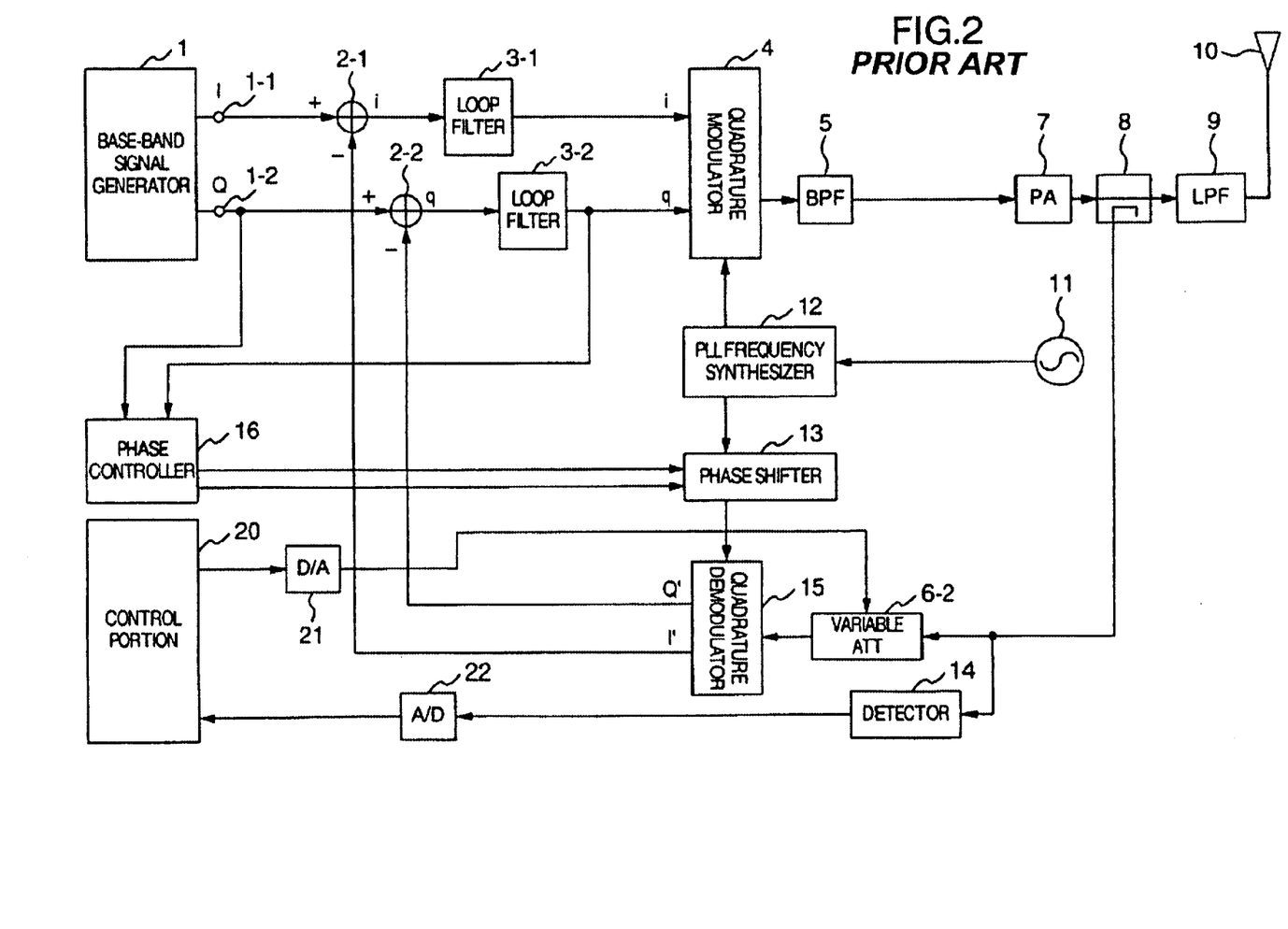
FIG. 2 is a block diagram of the construction of a transmission section of a conventional radio equipment.

Radio systems using a linear digital modulation system such as 16 QAM (Quadrature Amplitude Modulation) or π/4QPSK (Quadrature Phase Shift Keying) absolutely need the compensation for the non-linear distortion of power amplifier circuit, and employ various types of non-linear compensation system (linearizer). Of the compensation systems, the linearizer of Cartesian loop negative feedback system has been used from a long time ago. A conventional power amplifier circuit having a linear feedback circuit will be described with reference to FIG. 2. FIG. 2 is a block diagram of the construction of the transmission section (negative feedback power amplifier) of a radio equipment using the Cartesian loop negative feedback linearizer system.

A base-band signal generator 1 generates an in-phase component (I) and quadrature component (Q) of a base-band signal, and supplies them to adders 2-1, 2-2, respectively. The adder 2-1 adds the in-phase component (I) and an in-phase component (I') of a feedback signal, and supplies the resulting in-phase component (i) to a loop filter 3-1. Similarly, the adder 2-2 adds the quadrature component (Q) and an in-phase component (Q') of the feedback signal, and supplies the resulting quadrature component (q) to a loop filter 3-2.

The loop filter 3-1 restricts the frequency band of the input in-phase signal (i), and supplies it to a quadrature modulator 4. Similarly, the loop filter 3-2 restricts the frequency band of the input quadrature component signal (q), and supplies it to the quadrature modulator 4.

In addition, a reference signal generator 11 generates a reference frequency signal and supplies it to a PLL frequency synthesizer 12. The PLL frequency synthesizer 12 generates a carrier signal on the basis of the reference frequency signal, and supplies it to the quadrature modulator 4 and a phase shifter 13. The phase shifter 13 shifts the phase of the input carrier signal on the basis of a control signal fed from a phase controller 16, and supplies the phase-shifted carrier signal to a quadrature demodulator 15.

The quadrature modulator 4 produces a modulated signal with a desired frequency band as a result of the modulation of the carrier signal with the in-phase component (i) and quadrature component (q) of the input base-band signal, and supplies it to a band-pass filter 5 (BPF).

The band-pass filter 5 removes the unnecessary components from the modulated signal, and supplies it to a power amplifier (PA) 7. The power amplifier 7 amplifies the input signal to a specified output level, and supplies it to a directional coupler 8. The signal passed through the directional coupler 8 is supplied to a low-pass filter (LPF) 9 where the harmonic components are removed from the modulated signal, and then it is transmitted through an antenna 10.

This power amplifier circuit is constructed to have a Cartesian loop negative feedback linearizer. In other words, the directional coupler 8 supplies part of the output signal from the power amplifier 7 to a variable attenuator (ATT) 6-2. The variable attenuator 6-2 adjusts the power level of the input signal to a proper value, and supplies it to the quadrature demodulator 15. The quadrature demodulator 15 processes the input carrier signal from the phase shifter 13 and the input feedback signal from the variable attenuator 6-2 to produce the in-phase component (I') and quadrature component (Q') of the feedback base-band signal, and it supplies the in-phase component (I') to the (−) negative input terminal of the adder 2-1 and the quadrature component (Q') to the (−) negative input terminal of the adder 2-2.

Thus, the output from this power amplifier circuit is negatively fed back to the input of the power amplifier circuit.

In this negative feedback power amplifier circuit, in order to stabilize the system, it is necessary that the phases of the input signals (in-phase component (I) and quadrature component (Q)) and the corresponding feedback signals (in-phase component (I') and quadrature component (Q')) be coincide with each other. Therefore, the phase controller 16 controls the phase shifter 13 to shift the phase so that the phase differences between the input signals and the feedback signals are zero degrees. To this end, the quadrature component (Q) of the signal (input signal) fed from the base-band signal generator 1 to the adder 2-2, and the quadrature component (q) fed from the loop filter 3-2 to the quadrature modulator 4 are also supplied to the phase controller 16.

The adders 2-1, 2-2 work as subtracters. Alternatively, the adders 2-1, 2-2 may add the input signals to the feedback signals when the phase differences between the input signals and the feedback signals are controlled to be 180 degrees.

That is, the phase controller 16 compares the phase of the quadrature component (Q) of the input signal and the phase of the quadrature component (q) of the output signal from the adder 2-2, detects the phase deviation, and supplies to the phase shifter 13 the control signal to compensate for the detected phase deviation to a specified value. The phase shifter 13 shifts the phase of the carrier signal fed to the quadrature demodulator 15 on the basis of the input control signal. Thus, the input signals and the feedback signals at the adders 2-1, 2-2 can be adjusted in their phases so that the phase differences coincide with zero degrees.

Figure 5:
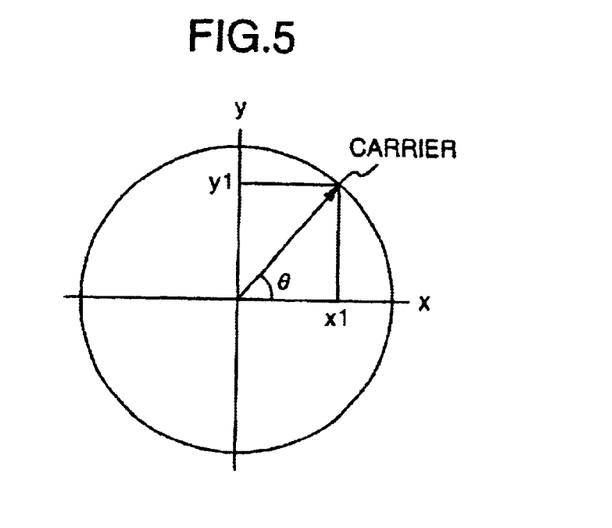
FIG. 5 is a diagram to which reference is made in explaining the operation of the phase shifter.

In the phase shifter 13, in order to attain an arbitrary phase shift as shown in FIG. 5, DC voltages (x1, y1) corresponding to the orthogonal coordinates (x, y) are applied to the carrier signal fed from the PLL frequency synthesizer 12, thereby making quadrature modulation to produce a carrier signal of a given initial phase (θ). FIG. 5 is a diagram for explaining the operation of the phase shifter. The abscissa is the in-phase component of the base-band signal, and the ordinate is the quadrature component of the base-band signal. Thus, the signal state is shown by the in-phase component-quadrature component plane.

If the power supply used in the phase shifter 13 is, for example, a single power source of +5 V, the possible operation range of the carrier signal is 0 V~5 V. In order to achieve the maximum signal dynamic range, the signal is required to be operated around the center of 2.5 V. At this time, 2.5 V is the reference voltage. Thus, the signal is operated around the reference voltage of 2.5 V. The DC voltage (control signal) fed to the phase shifter 13, in this case, is within the range of 2 V~3 V.

Moreover, in order to keep the output signal level from the transmission section (power amplifier circuit) constant, it is necessary to adjust the gain of the feedback path. In the negative feedback power amplifier circuit, when the loop gain is much larger than 1, the output level is generally determined by the gain (amount of attenuation) of the feedback path. Therefore, the signal level in the feedback path is necessary to be kept constant in order to make the output signal level constant.

In other words, a part (feedback signal) of the output signal that is fed back through the directional coupler 8 is supplied to a detector 14. The detector 14 detects the envelope of the input signal, and supplies a voltage proportional to the envelope signal level to an A/D converter 22. The A/D converter 22 converts the detected signal from the detector 14 to digital data, and supplies it to a control portion 20.

The control portion 20 controls the variable attenuator 6-2 so that the voltage level to be detected by the detector 14 can have a specified value. In this structure, a DC voltage is controlled via a D/A converter 21 to generate a control signal. This specified value is a signal level to be detected by the detector 14 when the output from the power amplifier 7 is a certain value. This value is experimentally determined. If the output value from the power amplifier 7 is, for example, 10 W as a predetermined value, and if the normal signal level to be detected by the detector 14 is 1 V, the specified value is this value of 1 V. The control portion 20 generates the control signal that controls so that the output from the detector 14 can be maintained to be 1 V, and supplies it to the D/A converter 21. The D/A converter 21 converts the DC voltage to analog data, and supplies it to the variable attenuator 6-2, controlling the amount of attenuation in the variable attenuator 6-2. Thus, the output voltage from the detector 14 controls the gain, i.e., feedback ratio of the feedback circuit, so that the output signal level from the power amplifier 7 can be maintained constant.

Figure 4:
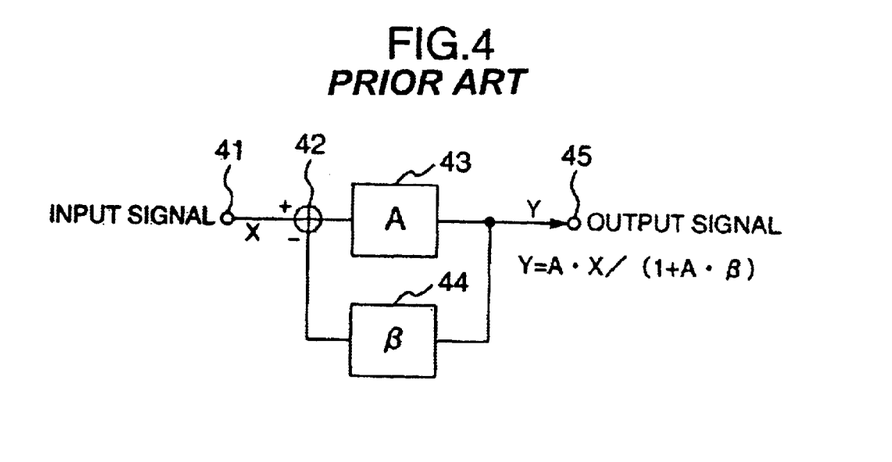
FIG. 4 is a block diagram showing the construction of a basic feedback amplifier circuit.

The negative feedback operation will be briefly described with reference to FIG. 4. FIG. 4 is a block diagram of the construction of the basic negative feedback power amplifier circuit.

Referring to FIG. 4, an input signal (signal level: X) is supplied via an input terminal 41 to an adder 42, and the output signal from the adder 42 is fed to an amplifier 43. The amplifier 43 gives the input signal a predetermined gain (A), and supplies it (signal level: Y) to an output terminal 45. The amplifier 43 supplies a part of the output signal (signal level: Y) to a feedback path circuit 44. The feedback path 44 gives the input signal a predetermine gain (β), and supplies it to the (−) negative input terminal of the adder 42. The adder 42 subtracts the fed-back signal at the output of the feedback path 44 from the input signal at the input terminal to produce the difference signal.

At this time, the output signal level Y is given as $$Y = A \cdot X/(1 + A \cdot \beta) \tag{1}$$

where (A·β) is the loop gain. If (A·β)>>1, the above equation can be expressed as $$Y \approx X/\beta,$$

and thus the output level can be determined by the gain (amount of attenuation) β of the feedback path.

Therefore, the output signal level Y can be maintained constant by the control in the variable attenuator 6-2 as shown in FIG. 2.

The amplifier 43 in FIG. 4 is formed of at least the loop filters 3-1, 3-2, quadrature modulator 4, band-pass filter 5, power amplifier 7, and a part of directional coupler 8 in FIG. 2. The feedback path 44 is formed of at least a part of directional coupler 8, the variable attenuator 6-2 and quadrature demodulator 15.

SUMMARY OF THE INVENTION

In the negative feedback amplifier shown in FIG. 4, the loop gain (=A·β) varies with the change of the gain A of the amplifier. Therefore, when the gain A of the amplifier is decreased, the distortion reducing effect is degraded, leading to the increase of the leakage power of the transmitted frequency band to the adjacent channels. On the contrary, when the gain A of the amplifier is increased, the phase margin or gain margin of the loop decreases, thus increasing the probability of oscillation when the transmission frequency is changed or when the radio equipment starts to operate. The factors to change the gain can be considered as irregular component characteristics, secular variation, and temperature change, and these factors deteriorate the transmission characteristics.

Figure 10:
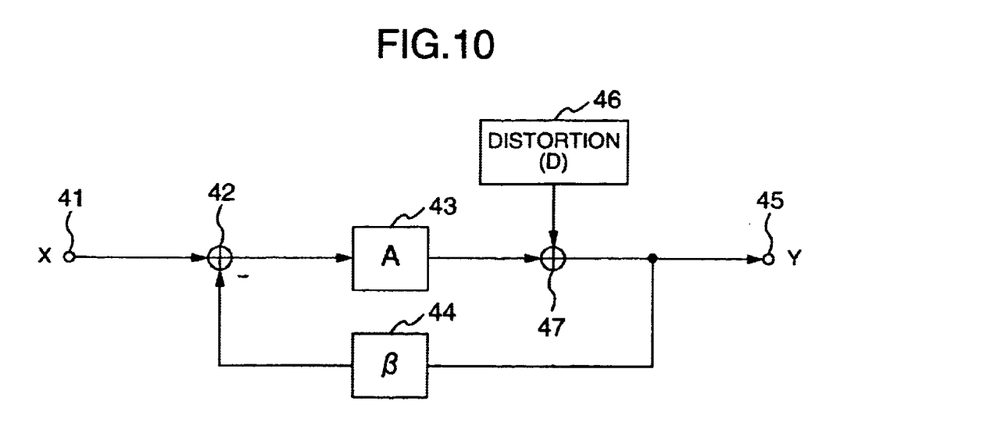
FIG. 10 is a block diagram useful for explaining that the loop gain value has an effect on the output distortion of the negative feedback amplifier.

Here, the variation of the loop gain A·β affects the distortion of the output signal as described briefly with reference to the model diagram of FIG. 10. In FIG. 10, a distortion component from a distortion source 46 is added to the signal in the amplifier. At this time, if the input level, the gain of the amplifier, the gain (feedback ratio) of the feedback path, the distortion component and the output level are represented by X, A, β, D and Y, respectively, the following equation is satisfied:

$$\begin{aligned} Y &= (X - Y \cdot \beta) \cdot A + D \\ &= A \cdot X/(1 + A \cdot \beta) + D/(1 + A \cdot \beta) \end{aligned} \tag{2}$$

Here, if A·β is much larger than 1, the above equation is reduced to $$Y = X/\beta + D/(A \cdot \beta) \tag{3}$$

That is, the effect of the distortion component D on the output level Y depends on the value of the loop gain (A·β). If, for example, the gain A of the amplifier is increased, the effect of the distortion component D is reduced. However, if the gain A of the amplifier is too large, oscillation is likely to occur. Therefore, it will be understood that in the negative feedback amplifier for transmitters it is very important to control the feedback ratio of the negative feedback circuit to be set to a predetermined value, keeping the output level constant, and control the value of the loop gain (A·β) to be appropriate.

It is an object of the invention to provide a negative feedback amplifier and method of controlling the loop gain thereof with the above drawbacks removed, and to provide an amplifier for radio equipment with the transmission characteristics not deteriorated.

According to the invention, there is provided a negative feedback amplifier comprising input portions for receiving input signals to said negative feedback amplifier, adder circuits coupled to said input portions, a quadrature modulator for performing a quadrature modulation on outputs of said adder circuits, a first signal level variable control circuit, coupled to said quadrature modulator, for adjusting a level of an output signal from said quadrature modulator, an amplifier circuit for amplifying an output of said first signal level variable control circuit, a feedback circuit for negative feedbacking an output of said negative feedback circuit to said adder circuit, said feedback circuit including a first control circuit for controlling a signal level of said feedback circuit so that said output signal level of said amplifier circuit becomes a predetermined value, and a second control circuit for controlling an adjusting amount in said first signal level variable control circuit based on the output signal levels of said adder circuits so that the output signal levels of said adder circuits becomes predetermined values.

According to the present invention, there is also provided a negative feedback amplifier for a transmitter having a quadrature modulator, comprising input portions for receiving an in-phase component (I) and quadrature component (Q) of a base-band signal, a negative feedback circuit for generating a negative feedback signal (I', Q') of said in-phase component (I) and quadrature component (Q) of said base-band signal on the basis of an output signal from said negative feedback amplifier, adder circuits for generating an output of addition of said in-phase component (I) of said base-band signal fed to said corresponding input portion of said negative feedback amplifier and said negative feedback signal (I') of said in-phase component, and an output of addition of said quadrature component (Q) of said base-band signal fed to said corresponding input portion of said negative feedback amplifier and said negative feedback signal (Q') of said quadrature component, an amplifier circuit that receives said outputs from said adder circuits and amplifies said outputs to produce an amplified output, a first detector circuit for detecting the output signal level of said amplifier circuit, a first level adjustment circuit for adjusting the signal level in said feedback circuit according to a first control signal, and a control circuit for generating a control signal for controlling said first level adjustment circuit according to the signal level detected by said first detector circuit so that the output from said amplifier circuit can be maintained to be a predetermined value, said amplifier circuit including loop filters for producing an in-phase signal component (i) and a quadrature signal component (q) resulting from limiting the frequency bands of said in-phase component and quadrature component of said base-band signal produced from said adder circuits, a quadrature modulator for orthogonally modulating a carrier signal with said in-phase signal component (i) and quadrature signal component (q) produced from said loop filters to produce a modulated signal, a second detector circuit for detecting either one of said in-phase signal component (i) and quadrature signal component (q) produced from said loop filters, and a second level adjustment circuit for adjusting the level of said modulated signal according to a second control signal, and said control circuit generating said second control signal for controlling said second level adjustment circuit according to the signal level detected by said second detector circuit so that the loop gain of said negative feedback amplifier can be maintained to be a predetermined value.

According to the present invention, there is further provided a gain control method of a negative feedback amplifier comprising the steps of: supplying an input signal to said negative feedback amplifier; inputting said input signal to an adder unit; performing a quadrature modulation in a quadrature modulator on an output of said adder unit; controlling a signal level of a negative feedback circuit for feedbacking said output of said negative feedback amplifier to said adder unit so that said output of said negative feedback amplifier becomes a predetermined level; and controlling a signal level of an output of said quadrature modulator based on the output of said adder unit so that said output of said adder unit becomes a predetermined output level.

Other objects, features and advantages of the invention will become apparent from the following description of the embodiments of the invention taken in conjunction with the accompanying drawings.

DESCRIPTION OF THE EMBODIMENTS

Figure 6:
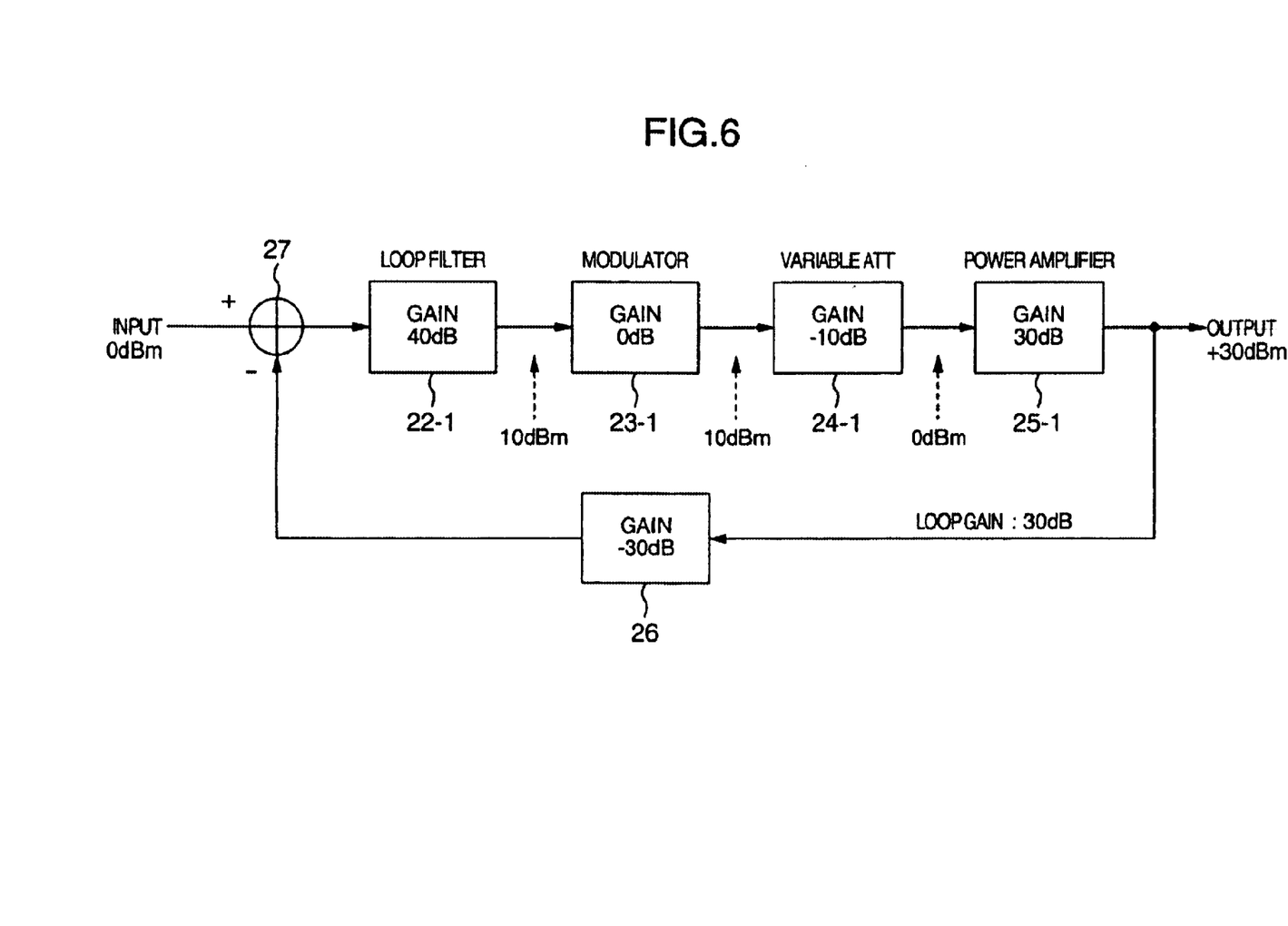
FIG. 6 is a block diagram of a negative feedback amplifier circuit useful for explaining the embodiments of the invention.
Figure 7:
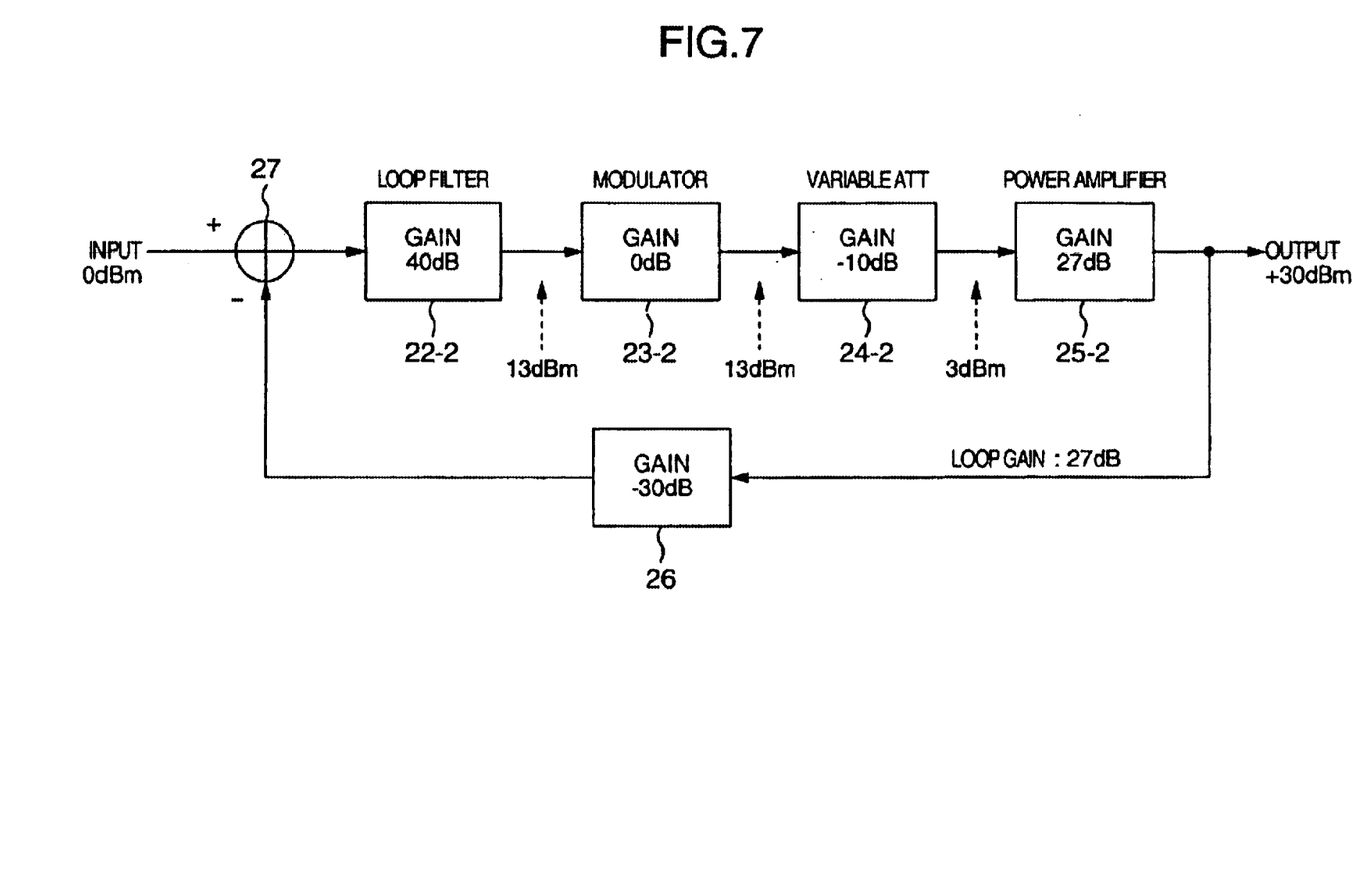
FIG. 7 is a block diagram of a negative feedback amplifier circuit useful for explaining the embodiments of the invention.
Figure 8:
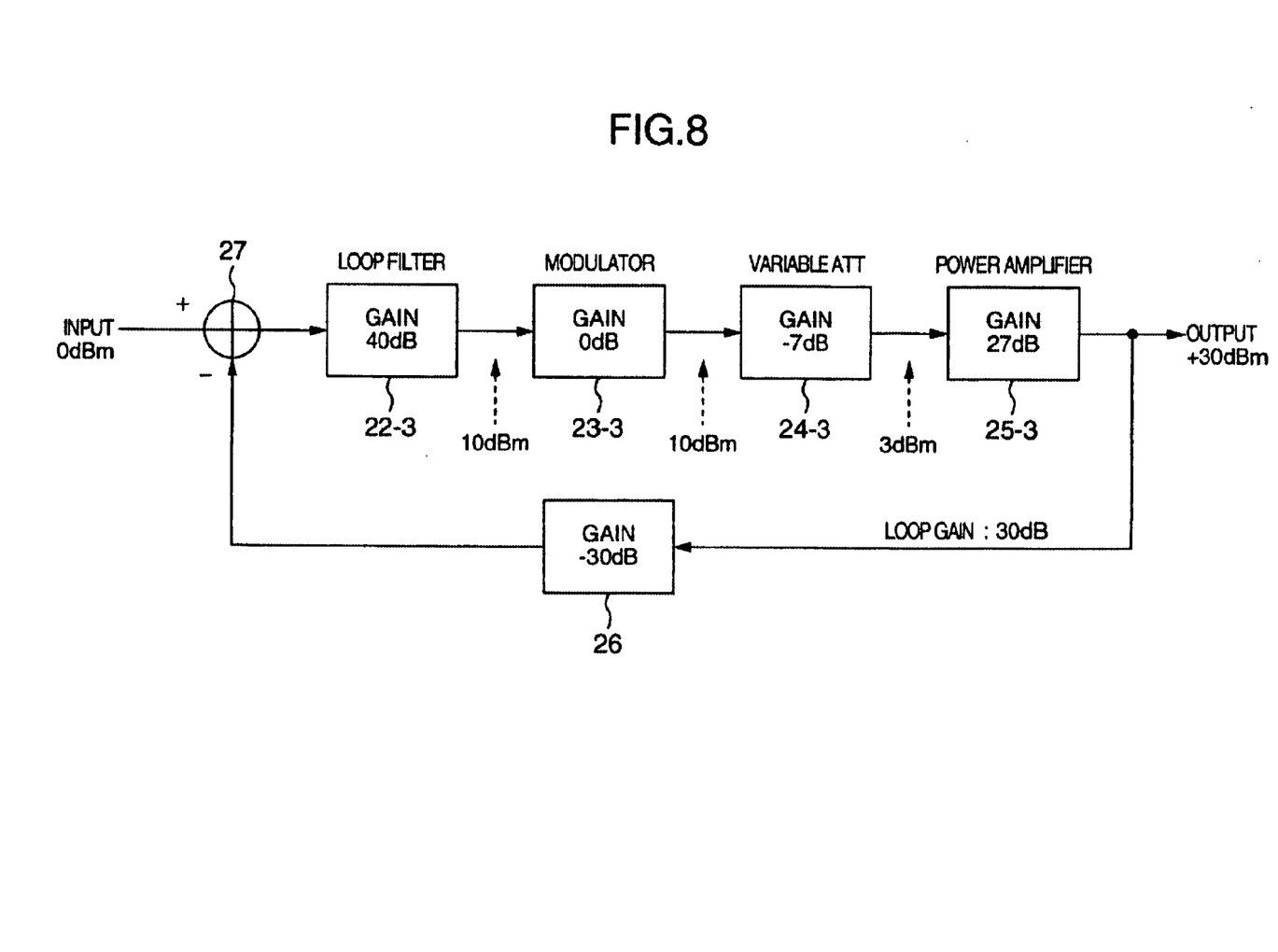
FIG. 8 is a block diagram of a negative feedback amplifier circuit useful for explaining the embodiments of the invention.

The operation principle of an embodiment of a negative feedback amplifier according to the invention will be described with reference to FIGS. 6, 7 and 8. FIGS. 6–8 are block diagrams of the constructions of models of a transmitter provided to describe the operation of the invention. FIGS. 6–8 are provided for explaining an operation of maintaining a loop gain by variably controlling a signal level of an amplifier when the loop gain was changed due to change of gain in the amplifier by some causes. In FIGS. 6–8, the values of input-output gains (dB) and the values of output level (dBm) of the circuit blocks in order to show the change of the signal levels in the amplifier and the feedback path. FIG. 6 shows distributed gains of the elements in operation at a specified level, FIG. 7 shows gains distributed when the gain of the power amplifier is reduced 3 dB, and FIG. 8 shows the operation for the improvement of the loop gain according to the invention.

The negative amplifiers shown in FIGS. 6-8 each include an adder 27, a loop filter 22-1, 22-2, 22-3, a modulator 23-1, 23-2, 23-3, a variable attenuator 24-1, 24-2, 24-3, a power amplifier 25-1, 25-2, 25-3, and a feedback path 26. The loop filter 22-n, modulator 23-n, variable attenuator 24-n and power amplifier 25-n (n=1~3) constitute the amplifier (corresponding to the block 43 in FIG. 4).

In FIG. 6, the input signal level is set for 0 dBm, the output signal level for +30 dBm, and the loop gain for 30 dB. The gains of the feedback path 26, loop filter 22-1, modulator 23-1, variable attenuator 24-1 and power amplifier are −30 dB, 40 dB, 0 dB, −10 dB, 30 dB, respectively. At this time, the output signal level of the variable attenuator 24-1 is 0 dBm, that of the modulator 23-1 is 10 dBm, that of the modulator 23-1 is 10 dBm, and that of the loop filter 22-1 is 10 dBm.

When the gain of the power amplifier 25-1 in FIG. 6 is changed resulting in the gain, 27 dB, of power amplifier 25-2 as in FIG. 7, the gain of the feedback path 26 is not changed, and thus the output signal level is +30 dBm. In addition, the output signal level of the variable attenuator 24-2 is 3 dBm, that of the modulator 23-2 is 13 dBm and that of the loop filter 22-2 is 13 dBm. Thus, the loop gain is 27 dB.

Since the output signal level of the loop filter 22-2 is changed 3 dB from the specified value of 10 dBm as shown in FIG. 7, the gain of the variable attenuator 24-3 is changed to −7 dB as shown in FIG. 8. The result is that the output signal level of the loop filter 22-3 is the specified value of 10 dBm, and the loop gain is also adjusted to be 30 dB.

Figure 1:
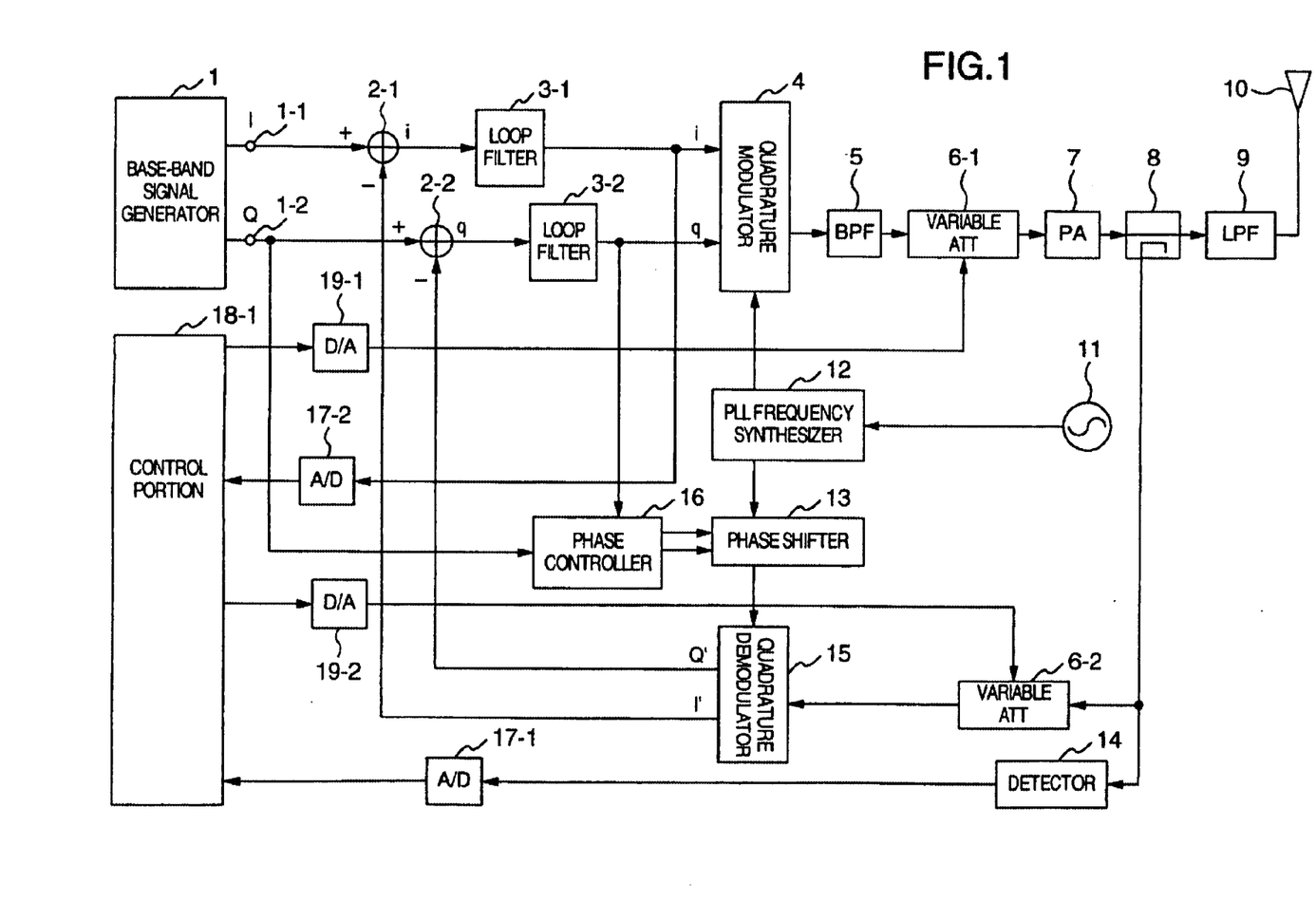
FIG. 1 is a block diagram of the construction of a transmission section of one embodiment of the invention.

Moreover, referring to FIG. 1, voltage variable attenuators 6-1, 6-2 can be replaced by gain control amplifiers for controlling the gains, such as AGC (Automatic Gain Control) amplifiers. The detection of the gains in the amplifier may be equivalently made by detecting the signals of quadrature components (Q).

One embodiment of the invention will be described in detail with reference to FIG. 1. FIG. 1 is a block diagram showing the construction of the transmission section (negative feedback power amplifier circuit) of a digital radio equipment according to the invention. The power amplifier circuit of FIG. 1 has an A/D converter 17-1, a D/A converter 19-2, and a control portion 18-1 in place of the A/D converter 22, D/A converter 21 and control portion 20 of the construction of the transmission section shown in FIG. 2. In addition, a variable attenuator 6-1, an A/D converter 17-2 and a D/A converter 19-1 are added. The in-phase component (i) supplied from the loop filter 3-1 to the quadrature modulator 4 is also applied to the A/D converter 17-2 and then from the A/D converter 17-2 to the control portion 18-1. The output signal from the control portion 18-1 is fed to the D/A variable attenuator 6-1 via the D/A converter 19-1.

As with the construction of FIG. 2, the base-band signal generator 1 generates the in-phase component (I) and quadrature component (Q) of the base-band signal, and supplies them through the input terminals 1-1, 1-2 to the adders 2-1, 2-2. Then, the same operation as in FIG. 2 is made to process the signal, and to transmit it via the antenna 10. Part of the output signal that is fed back from the directional coupler 8 is also negatively fed back to the adders 2-1, 2-2 by the same operation as in FIG. 2.

In FIG. 1, the loop filters 3-1, 3-2, the quadrature modulator 4, the band-pass filter 5, the variable attenuator 6-1, the power amplifier 7 and a part of the directional coupler 8 constitute the amplifier, and while a part of the directional coupler 8, the variable attenuator 6-2 and the quadrature demodulator 15 constitute the feedback path.

Also, as with the construction of FIG. 2, the phase shifter 13 is controlled by the phase controller 16 so that the phase difference between the input signal and the feedback signal is zero degree. The phase control can be made by a method disclosed in co-pending applications Ser. No. 09/672,688 and Ser. No. 09/768,469.

The amplifier 43 in FIG. 4 is formed of, at least, the loop filters 3-1, 3-2, quadrature modulator 4, band-pass filter 5, variable attenuator 6-1, power amplifier 7, and a part of directional coupler 8 as shown in FIG. 1. The feedback path 44 is formed of, at least, a part of directional coupler 8, the variable attenuator 6-2, and quadrature demodulator 15.

Then, the output level is adjusted. Part of the output signal is fed back from the directional coupler 8, and a part of the fed-back output signal is detected in its envelope by the detector 14. The detector 14 detects the envelope of the input signal, and supplies a voltage proportional to that signal level to the A/D converter 17-1. The A/D converter 17-1 converts the detected signal from the detector 14 to digital data, and supplies it to the control portion 18-1. The control portion 18-1 supplies a DC voltage to the D/A converter 19-2 so that the detected voltage level can be made a specified value. The D/A converter 19-2 converts the DC voltage to analog data, and supplies it to the variable attenuator 6-2, controlling the amount of attenuation in the variable attenuator 6-2. Thus, the output signal level from the power amplifier 7 can be maintained constant by the output voltage from the detector 14.

Under the condition that the output signal level from the power amplifier 7 is kept to be a specified value by the above processing, part of the output (i) from the loop filter 3-1 is then supplied from the A/D converter 17-2 to the control portion 18-1. The control portion 18-1 calculates the average value of the actual signal level fed to the quadrature modulator 4 on the basis of the signal from the A/D converter 17-2. Under the condition that the gains of the amplifier and feedback path are specified values, the control portion 18-1 also compares the actual average value with the correct input signal level to the quadrature modulator 4. Then, the control portion 18-1 generates a control signal according to the compared result, and supplies it to the D/A converter 19-1. The analog control signal from the D/A converter 19-1 controls the variable attenuator 6-1 so that the output signal level from the loop filter 3-1 can be kept constant, or that the loop gain can be maintained constant.

Figure 9:
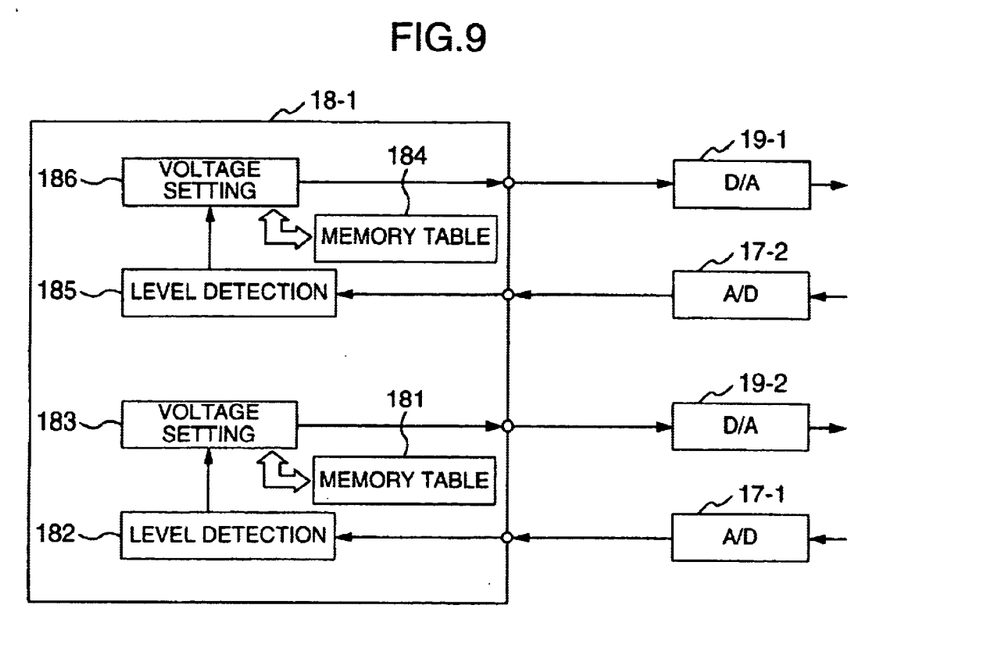
FIG. 9 is a diagram showing one example of the internal construction of the control portion 18-1 in the first embodiment of the invention.

Here, one example of the internal construction of the control portion 18-1 will be described with reference to FIG. 9. A memory table 181 is provided to have stored therein pairs of different detected signal levels and control signal values that control so that correct signal levels can be generated in the feedback path under the condition that the output from the amplifier (output from the negative feedback amplifier) becomes a specified value. These data are experimentally determined in advance, and stored in the memory. The digital signal fed from the A/D converter 17-1 is supplied to a level detector 182 where its level is decided. A voltage setting device 183 is responsive to the decided level to read out the control signal of a value from the memory table 181, and supplies it to the D/A converter 19-2. This control signal controls the amount of attenuation of signal in the variable attenuator 6-2, thus controlling the feedback ratio of the feedback path.

A memory table 184 is also provided to have stored therein data of control values associated with different detected output values from the loop filter 3-1 in order that the output from the loop filter 3-1 can be controlled to be a proper value under the condition that the gain of the amplifier and the feedback ratio of the feedback path have predetermined values, respectively. These data are experimentally determined in advance, and stored in the memory. The digital signal produced from the A/D converter 17-2 after the output signal from the loop filter is fed to the converter is supplied to a level detector 185 where its level is decided. A voltage setting device 186 is responsive to this level to read out the control signal of a value from the memory table 184, and supplies it to the D/A converter 19-1. This control signal controls the amount of attenuation of signal in the variable attenuator 6-1, thus controlling the gain of the amplifier so that the loop gain can be controlled. The control portion 18-1 may be replaced by a digital signal processor (DSP).

Figure 3:
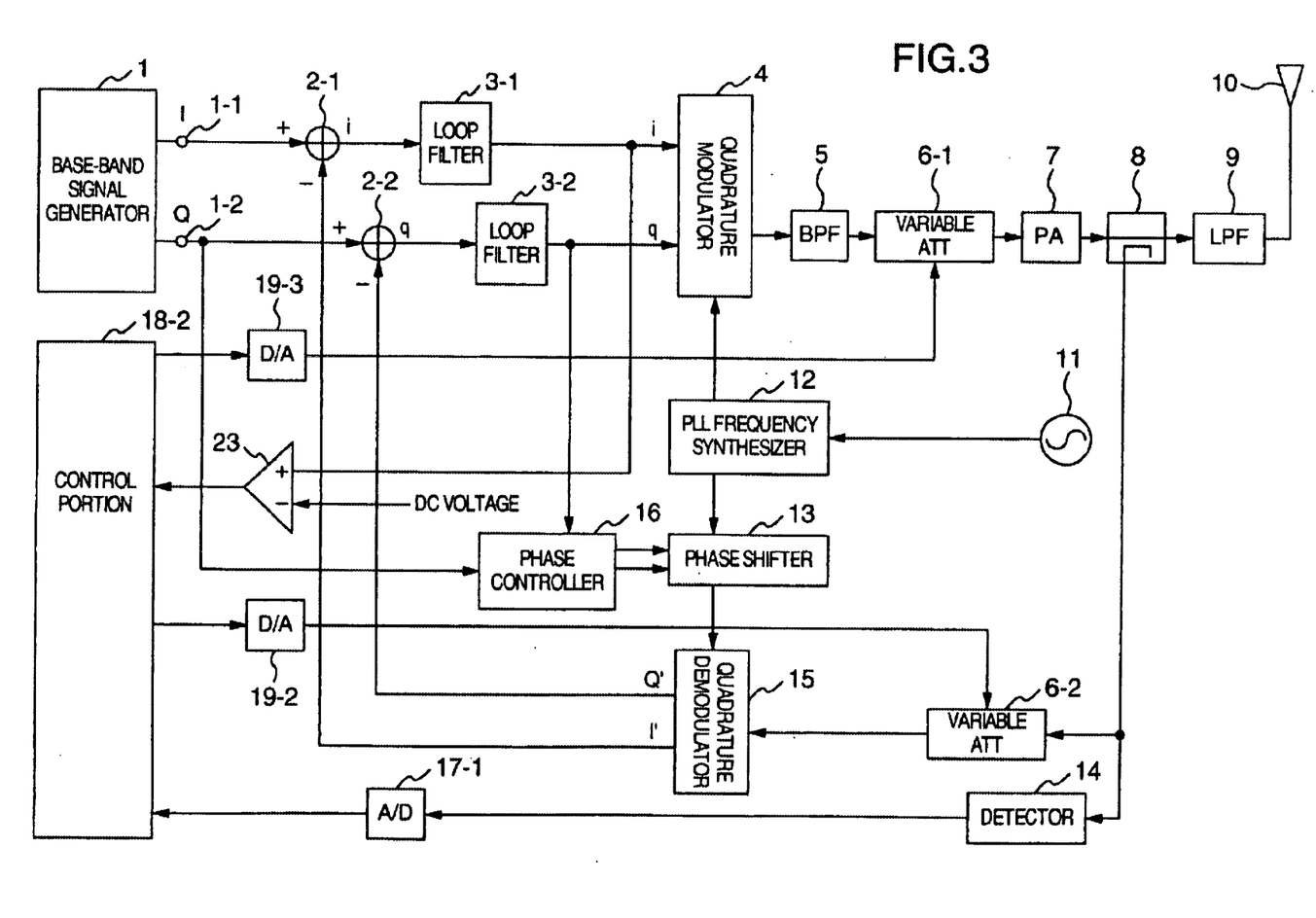
FIG. 3 is a block diagram of the construction of a transmission section of another embodiment of the invention.

The second embodiment of the invention will be described with reference to FIG. 3. FIG. 3 is a block diagram showing the construction of the transmission section (power amplifier) of a digital radio equipment according to the invention. Another embodiment concerning the detection of the gain of the amplifier will be described with reference to FIG. 3. The construction of FIG. 3 has a comparator 23 and a control portion 18-2 provided in place of the A/D converter 17-2 and control portion 18-1 in the construction of FIG. 1, respectively. The in-phase component (i) from the output of the loop filter 3-1 is supplied to an input terminal of the comparator 23, and compared with a reference voltage (a DC voltage applied to the other terminal of the comparator 23). The compared result is fed to the control portion 18-2.

In FIG. 3, the loop filters 3-1, 3-2, the quadrature modulator 4, the band-pass filter 5, the variable attenuator 6-1, the power amplifier 7 and a part of the directional coupler 8 constitute the amplifier, and while a part of the directional coupler 8, the variable attenuator 6-2 and the quadrature demodulator 15 constitute the feedback path.

In FIG. 3, the elements except the detection of signal level of the amplifier at the output of the loop filter 3-1 are the same as in FIG. 1, and will not be described.

First, the base-band signal generator 1 does not generate the quadrature component (Q) of base-band signal (Q=0), but generates the in-phase component (I) that is a DC voltage in order to make the transmission output a specified level. At this time, the output from the loop filter 3-1 is fed to the comparator 23, and compared with the reference voltage in the comparator 23. This reference voltage is set to be equal to the output voltage produced from the loop filter 3-1 when each gain (the respective gains of the amplifier and feedback path) satisfies a specified value.

The control portion 18-2 controls the variable attenuator 6-1 to continuously operate through the D/A converter 19-2. At this time, when the output from the comparator 23 is changed from "H" (high) level to "L" (low) level (or vice versa), the variable attenuator 6-1 has a set value for making the loop gain constant. This set value is used for the transmission operation. Although the comparator compares the in-phase component (i) with the reference voltage in this embodiment, the same result can be obtained even if the quadrature component (Q) is compared therewith.

Also, the construction in which the in-phase component and the quadrature component are interchanged contrary to the embodiments of FIGS. 1 and 3 may be used.

When the gain of the amplifier is detected and controlled to be kept constant, the place where the gain is detected may be anywhere in the place where the amplifier is constructed, such as the output end of quadrature modulator 4, and the input or output end of the power amplifier 7 though it was the input end of the quadrature modulator 4 in the above embodiments.

In above explained embodiments of the invention, the variable attenuators are used for adjusting or controlling the signal levels (gains) of the amplifier and the feedback path. Since the variable attenuator only reduce the signal level, it is necessary to preset the initial value of the attenuation level capable of increasing and decreasing the attenuation amount. However, according to the present invention, an automatic gain control amplifier (AGC) or a signal level variable control circuit may be used instead of the variable attenuator. The AGC can increase and decrease the signal level. When the AGC is used, the gain can be increased if the signal level is decreased in the amplifier so as to maintain an optimum loop gain value. In the case of using the AGC, the control process of the loop gain and the feedback ratio is substantially same as that of the above explained embodiments.

According to the invention, even if the gain of the amplifier is changed, the loop gain can be detected by detecting the signal level in the amplifier after adjusting the gain of the feedback path, and the loop gain can be adjusted to be a specified value by adjusting the gain of the amplifier, so that the transmission characteristics can be stabilized.

It should be further understood by those skilled in the art that the foregoing description has been made on embodiments of the invention and that various changes and modifications may be made in the invention without departing from the spirit of the invention and the scope of the appended claims.

What is claimed is:

1. A negative feedback amplifier comprising:
   an input portion for receiving an input signal to said negative feedback amplifier;
   an adder unit coupled to said input portion;
   a quadrature modulator for performing a quadrature modulation on an output of said adder unit;
   a first signal level variable unit coupled to said quadrature modulator;
   an amplifier unit coupled to said first signal level variable unit;
   a feedback circuit for negative feedbacking an output of said amplifier unit to said adder unit, said feedback circuit including a first control unit for controlling a signal level of said amplifier unit; and
   a second control unit, coupled to said adder unit, for controlling an output of said first signal level variable unit so that said output of said adder unit becomes a predetermined output level,
   wherein said first control unit has a first detection circuit for detecting a first signal that represents said output level from said amplifier unit and a second signal level variable unit for adjusting the signal level of said feedback circuit based on said first signal,
   wherein said second control unit has a second detection circuit for detecting a second signal that represents an output level of said adder unit, and controls said output level of said first signal level variable unit based on said second signal,
   wherein said first and second control units detect said signal levels of said feedback circuit and said adder unit, and compare said signal levels of said feedback circuit and said adder unit, and
   wherein said first signal level variable unit is controlled based on a result of the comparison.

2. A negative feedback amplifier according to claim 1, wherein said first and second control units are constructed by one unit.

3. A negative feedback amplifier according to claim 1, wherein said input portion comprises:
   a plurality of input terminals for receiving an in-phase component and a quadrature component of a base-band signal, respectively,
   wherein said adder unit comprises:
   a plurality of adder circuits coupled to said input terminals, respectively, and
   wherein an in-phase component and a quadrature component of a feed-back signal of said feedback circuit are applied to said adder circuits, respectively.

4. A negative feedback amplifier comprising;
   input portions for receiving an in-phase component and a quadrature component of a base-band signal;
   adder circuits coupled to said input portions, respectively;
   a quadrature modulator, coupled to said adder circuits through loop filters, for performing a quadrature modulation on outputs of said adder circuits;
   a first signal level variable unit coupled to said quadrature modulator
   an amplifier unit coupled to said first signal level variable unit;
   a feedback circuit for negative feedbacking in-phase component and a quadrature component signals of an output of said amplifier unit to said adder circuits, said feedback circuit including a second signal level variable unit and a first control unit, said second signal level variable unit being controlled by said first control unit; and
   a second control unit, coupled to one of said loop filters, for controlling an output of said first signal level variable unit so that said output of said adder unit becomes a predetermined output level,
   wherein said first control unit has a first detection circuit for detecting a first signal that represents said output level from said amplifier unit and a second signal level variable unit for adjusting the signal level of said feedback circuit based on said first signal,
   wherein said second control unit has a second detection circuit for detecting a second signal that represents an output level of said adder unit, and controls said output level of said first signal level variable unit based on said second signal, wherein said first and second control units detect said signal levels of said feedback circuit and said adder unit, and compare said signal levels of said feedback circuit and said adder unit, and wherein said first signal level variable unit is controlled based on a result of the comparison.

5. A negative feedback amplifier for a transmitter having a quadrature modulator, comprising:

input portions for receiving an in-phase component and quadrature component of a base-band signal;

a feedback circuit for generating negative feedback signals of said in-phase component and quadrature component of said base-band signal based on an output signal from said negative feedback amplifier;

adder circuits for generating an output of addition of said in-phase component (I) of said base-band signal to said input portion of said negative feedback amplifier and said negative feedback signal of said in-phase component, and an output of addition of said quadrature component of said base-band signal to said input portion of said negative feedback amplifier and said negative feedback signal of said quadrature component;

an amplifier circuit that receives said outputs from said adder circuits and amplifies said outputs to produce an amplified output;

a detector circuit for detecting the output signal level from said amplifier circuit;

a first level adjustment circuit for adjusting said signal level in said feedback circuit according to a first control signal; and a control circuit for generating a control signal by which said first level adjustment circuit is controlled according to the signal level detected by said detector circuit so that the output from said amplifier circuit can be maintained to be a certain value, wherein said amplifier circuit comprises:

loop filters for producing an in-phase signal component and a quadrature signal component resulting from limiting the frequency bands of said in-phase component and quadrature component of said base-band signal produced from said adder circuits, a quadrature modulator for orthogonally modulating a carrier signal with said in-phase signal component and quadrature signal component produced from said loop filters to produce a modulated signal, a comparator circuit for comparing the signal level of either one of said in-phase signal component and quadrature signal component produced from said loop filters, as a first input signal, and a predetermined reference signal, as a second input signal, and producing result of the comparison, and a second level adjustment circuit for adjusting the signal level of said modulated signal according to a second control signal, and wherein said control circuit generates said second control signal for controlling said second level adjustment circuit so that the loop gain of said negative feedback amplifier can be maintained to be a predetermined value in accordance with the result of the comparison when a certain DC voltage is applied to said input portion as either one of said in-phase component and quadrature component of said base band signal with the other made zero level.

6. A gain control method of a negative feedback amplifier comprising the steps of:

supplying an input signal to said negative feedback amplifier;

inputting said input signal to an adder unit;

performing a quadrature modulation in a quadrature modulator on an output of said adder unit;

first controlling a signal level of a negative feedback circuit for feedbacking an output of said negative feedback amplifier to said adder unit so that said output of said negative feedback amplifier becomes a predetermined level; and second controlling a signal level of an output of said quadrature modulator based on the output of said adder unit so that said output of said adder unit becomes a predetermined output level.

wherein said first controlling step detects a first signal that represents said output level from said amplifier unit and adjusts the signal level of said negative feedback circuit based on said first signal, wherein said second controlling step detects a second signal that represents an output level of said adder unit, and controls said output level of said first controlling step based on said second signal, wherein said first and second controlling steps detect said signal levels of said negative feedback circuit and said adder unit, and compare said signal levels of said negative feedback circuit and said adder unit, and wherein said output level of said first controlling step is controlled based on result of the comparison.

* * * * *